United States Patent [19]

Blonder et al.

[11] Patent Number: 4,579,807
[45] Date of Patent: Apr. 1, 1986

[54] OPTICAL INFORMATION STORAGE

[75] Inventors: Greg E. Blonder, Maplewood; Arthur F. Hebard, Bernardsville, both of N.J.

[73] Assignee: AT&T Bell Laboratories, Murray Hill, N.J.

[21] Appl. No.: 597,433

[22] Filed: Apr. 6, 1984

[51] Int. Cl.$^4$ .................................. G03C 5/24
[52] U.S. Cl. ..................... 430/269; 430/270; 430/495; 430/935; 430/945; 430/19; 430/496; 346/135.1
[58] Field of Search ............... 430/495, 496, 935, 19, 430/269, 270, 945; 346/135.1, 76 L; 430/524

[56] References Cited

U.S. PATENT DOCUMENTS

| 4,062,685 | 12/1977 | Takeda et al. | 96/88 |
| 4,198,237 | 4/1980 | Nahara et al. | 430/415 |
| 4,278,734 | 7/1981 | Ohta et al. | 346/76 L |
| 4,291,119 | 9/1981 | Kido et al. | 430/495 |
| 4,340,959 | 7/1982 | Levin | 346/135.1 |

OTHER PUBLICATIONS

Hebard, et al; *Structural Phase Transitions of Indium/Indium Oxide Thin-Film Composites*, Appl. Phys. Lett. 41 (12) Dec. 1982 pp. 1130–1132.

Vandenberg, et al; *Structural Aspects of Tunnel-Junction Coupled Granular Lead Films*, J. Vac. Sci. Technol. 18(2), Mar. 1981, pp. 268–272.

*Primary Examiner*—Won H. Louie
*Attorney, Agent, or Firm*—Bruce S. Schneider

[57] ABSTRACT

An optical disc including a medium having both a continuous phase and a non-continuous phase yields excellent contrast and stability for optical recording purposes. Exemplary of materials that form the desired multi-phase system are those produced by sputtering metals such as indium in an oxygen environment.

27 Claims, 5 Drawing Figures

OPTICAL INFORMATION STORAGE

BACKGROUND OF THE INVENTION

1. Field of the Invention

This invention relates to information storage and, in particular, to optical information storage.

2. Art Background

A variety of systems has been proposed and employed for the optical storage of data. An example of these systems is the use of tellurium alloys that are deposited on a substrate. To store information in such a medium, a localized region of the tellurium alloy is melted. By melting and/or ablating the tellurium alloy in a localized area, a void is produced that exposes the underlying substrate. Two typical storage medium configurations are employed to produce an optical change upon void formation. In the first configuration, a second substrate is affixed below and spaced from a tellurium coated, transparent substrate so that an air space is provided between the two substrates. Since the tellurium alloy has a smooth surface, reflection occurs before a void is formed. After void formation, light traverses the first transparent substrate and is internally reflected in the air space until it is absorbed. Thus, the untreated surface appears reflective, and the voids appear black.

In a second configuration, the tellurium alloy is deposited on a transparent dielectric which in turn overlies a metallized substrate. The thickness of the dielectric is carefully chosen to produce destructive interference of the incident light used for writing the stored information. Thus, before writing, the medium absorbs at the wavelength of the reading light source. Where voids are formed, the absence of the tellurium alloy precludes destructive interference of the reading light. Light is reflected from the exposed, underlying metallized surface and is thus observed. Therefore, in either configuration, digital information is represented by optically absorbing areas and optically reflective areas. By using a laser to write such information, it is possible in a tellurium based medium to store data with a storage density on the order of 30 megabits per square centimeter. (Storage density is the number of bits stored per unit surface area of the storage medium.)

Despite extensive investigation, there is still a number of considerations which make a tellurium based medium somewhat undesirable. In all configurations, the tellurium alloys employed are relatively unstable. Tellurium readily oxidizes in the atmosphere to form transparent oxides of tellurium. Obviously, the transparent tellurium oxide is no longer suitable for optical storage. To prevent extremely rapid oxidative degradation of the tellurium medium, it is necessary to employ a hermetic sealant. This sealant substantially increases the cost of the storage medium. Further, in extreme oxidation conditions such as in fires, toxic tellurium compounds are formed and present a potential health hazard. In this regard, the use of tellurium in the fabrication of such media also requires suitable precaution to insulate workers from tellurium exposure.

Additionally, the contrast between the absorbing tellurium alloy and a void, although acceptable, leads to a certain degree of error upon reading the stored information by using a light source, such as a laser, and a detector, such as a silicon photodiode, to discern these optical differences. (Contrast is the ratio of the optical reflectance of the initial medium to the optical reflectance of the written medium or the inverse of this ratio, whichever is larger.) Ideally, for relatively accurate retrieval, contrasts greater than 5 to 1 are desirable. By various expedients, e.g., by increasing the tellurium alloy thickness, tellurium based storage media have been made with contrasts typically up to 15 to 1. However, the use of these expedients generally substantially increases the energy needed to write information. Although the contrast and sensitivities of tellurium are adequate to produce useful storage media, these contrast levels, together with the relative instability of the medium, are not entirely desirable.

SUMMARY OF THE INVENTION

An optical storage medium having desirable contrasts, e.g., contrasts up to 60 to 1, quite acceptable threshold sensitivities, e.g., on the order of 5 milliwatts/$\mu m^2$, and relative stability in typical environments has been produced. This medium includes at least two phases, at least one being continuous and at least one being discontinuous and thus forming inclusions, i.e., disjoint regions, within the other phases. (A phase is continuous when it is possible to reach any portion of the phase from any other portion of the phase without the necessity of traversing material of a second phase.) The phase compositions are chosen so that the medium surface is smooth, as produced by chemical bonding between phases, and so that upon application of the writing energy to a localized region, e.g., an area smaller than 2 $\mu m^2$, i.e., a storage region, the volume of at least one phase changes. To ensure the appropriate phase change, two criteria should be satisfied. Firstly, in at least 90 percent of medium-regions to be written, there should be at least 100 inclusions. (A medium-region to be written is defined by the volume of the medium which will be induced to undergo a change by the application of the writing beam.) Secondly, for an inclusion to be counted in the 100-inclusion criterion, its diameter should be in the range of 50 Angstroms to $\frac{1}{4}$ of the wavelength of the light ultimately utilized to write information.

The inventive medium in one embodiment is advantageously formed by simultaneously depositing at least two materials on a deposition substrate. The deposited materials should satisfy three criteria: (1) at least one material should have a relatively high mobility on the surface of the substrate in the absence of any other material, (2) a second material should have a relatively low mobility, again in the absence of other materials, and (3) during the simultaneous deposition of the two materials, the high mobility material in the presence of the second material should have a relatively low mobility. Generally, the high mobility material forms inclusions within a continuous phase formed by the low mobility material. However, under certain circumstances, for the codeposition of indium (typically high mobility) and indium oxide (typically low mobility), the indium oxide component is formed in an indium based composition continuous phase. (See Hebard and Nakahara, *Applied Physics Letters*, 41, page 1130 (1982).) Nevertheless, although the mechanisms have not entirely been discerned, the satisfaction of the mobility criterion yields the desired configurations.

DETAILED DESCRIPTION

Figure 1:
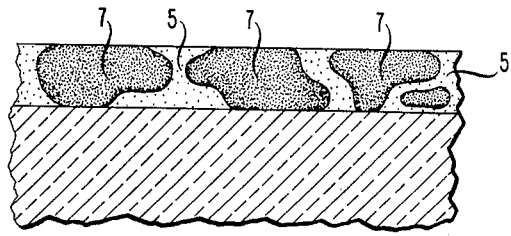
FIGS. 1 and 2 are illustrative of medium configurations involved in the invention.

As discussed, the inventive storage media should have at least two phases. (For purposes of this disclosure, a region is a single phase if throughout this region, the material is (1) the same state of matter, e.g., liquid or solid, (2) the same level of ordering, e.g., all amorphous or the same crystal structure with lattice parameters varying less than 1 percent, and (3) has the same composition within 10 percent.) One phase, as shown, for example, by light stippling in FIG. 1, should be continuous. (A phase for the purposes of this disclosure is considered continuous if an imaginary route from any point within the phase to any other point within the phase can be drawn without necessarily entering another phase.) There should also be one or more phases present that are discontinuous and that together with the continuous phase(s), form a medium with a smooth surface. This smooth surface is the result of a strong interaction between phases, e.g., a chemical bond interaction, and is defined as a surface which, in the areas to be written, has an absolute rms thickness variation of no greater than 25 Angstroms. (Thickness variation, for purposes of this disclosure, refers to rms variation.) Thus, as shown in FIG. 1, inclusions, 7, form a discontinuous phase within a continuous phase, 5.

To produce an optical change, energy such as coherent radiation, e.g., laser radiation, typically at a power level of 5 to 40 milliwatts/$\mu m^2$, is applied to a medium-region to reduce the volume of at least one phase in that region, e.g., to increase one phase at the expense of another. By changing the relative volume of the phases, an optical change is effected. However, to ensure that this optical change is sufficiently large to yield a suitable contrast, the average number of inclusions in each writing region should be at least 100. (A writing region is a discrete region in which a reduction in the amount of at least one phase is to be induced by the writing beam.) To determine the number of inclusions, only inclusions with a diameter in the range 50 Angstroms to $\frac{1}{4}$ the wavelength of the light utilized to write the information are counted. (When writing radiation is utilized that is, in essence, polychromatic, the wavelength of the writing light is considered equal to the wavelength causing the largest phase volume change considering the intensity of this wavelength in the beam and the degree of change induced by each unit of intensity at this wavelength.)

Figure 2:
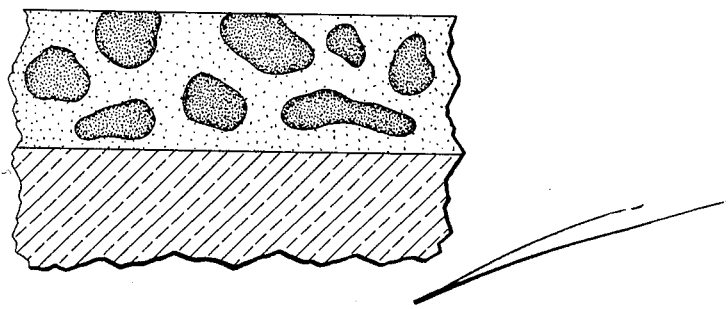

The manner of defining the inclusion diameter depends on the thickness of the medium. Typically, for thicknesses in the range 25 Angstroms to 500 Angstroms, the inclusions extend from the deposition substrate to the surface of the medium. In this situation, the medium in essence acts as a two-dimensional entity. In contrast, for thicknesses typically greater than 500 Angstroms, inclusions as shown in the cross-sectional view of FIG. 2 do not extend from the substrate to the surface of the medium. In this situation, the medium is considered a three-dimensional configuration. For the two-dimensional situation, the diameter of an inclusion is that of a circle having the same area as the surface area produced by projecting the inclusion onto the surface of the medium. In the three-dimensional case, the diameter is that of a sphere having the same volume as that of the inclusion being measured.

The particular configuration in which the medium is utilized is not critical. For example, the medium can be utilized as directly formed on a substrate. Alternatively, media such as previously described utilizing interference or reflective effects are also useful. Typically, the thicknesses of the medium material should be greater than 25 Angstroms. Thicknesses less than 25 Angstroms are not desirable because generally continuous films are not produced. Thicknesses greater than that which prevent the incident writing radiation from inducing a phase rearrangement from the surface upon which the radiation is incident entirely through the layer are generally not economic. Therefore, although not precluded, these thicknesses are typically disadvantageous. For typical materials, thicknesses greater than 1000 Angstroms generally do not allow phase rearrangement through the layer.

The inventive media are formed in one embodiment by simultaneously introducing a flux of at least two materials onto the deposition substrate. The material in each flux should be carefully chosen. There should be at least one material, i.e., a first material, which has a high mobility on the surface of the bare deposition substrate and a second material that has a relatively low mobility on the bare deposition substrate. Additionally, the first material should also behave on the substrate as a low mobility material in the presence of the second material. For purposes of this disclosure, the mobility of a material is determined by measuring a curve of average thickness versus deviation from this thickness. Thus, in determining whether two materials satisfy the mobility criteria, first the deviation from average thickness curve of one material on the bare deposition substrate is compared to that of the second in similar circumstances. To satisfy the criterion relating to the use of high and low mobility material, the absolute deviation from average thickness for the high mobility material measured at 250 Angstroms total thickness should be the same as, or higher than, the deviation for the low mobility material measured at a total thickness of 25 Angstroms. To satisfy the second criterion, the deviation from average thickness curve for the high mobility material measured in the presence of the low mobility material should be within 100 percent of that for the lower mobility material. Exemplary of materials that satisfy these criteria are metals as a first material and compositions of these metals as the second.

Mobility curves for a wide variety of materials have been measured and are found in *Handbook of Thin Film Technology*, L. Maissel and R. Glang, Chapter 8, McGraw-Hill, New York (1970), *Applied Optics*, 20(4), Bennett and Davey, page 1785 (1981), and *Applied Optics*, 20(10), Sommargren, page 1785 (1981). The absolute flux of each combination, their relative fluxes, and the angle at which they impact the substrate influence the deviation from average thickness curve. Typically, absolute fluxes in the range 0.1 Angstrom/second to 100 Angstroms/second and relative fluxes of the high-to-low mobility material in the range 10 to 0.1 are utilized. Typically for these fluxes, incident angles in the range 0 to 45 degrees measured from a normal to the substrate are employed. A control sample is performed to determine the flux rates and the angles which satisfy the mobility conditions and which yield inclusions of the appropriate size.

In a preferred embodiment, the material fluxes are produced by bombarding a target, e.g., a metal target such as an indium, tin, copper, lead, or aluminum in the presence of a gas that reacts with the metal, e.g., oxygen and/or nitrogen. In this manner, the metal is sputtered from a target and, in part, reacts with the reactive gas. Additionally, oxides are formed on the target and then removed through the sputtering process. Thus, in the case of indium, both an elemental indium flux and a flux including indium oxides and/or nitrides reach the substrate. (The composition of the flux reaching the target is different for a previously unused target than for an established target, since compositions such as oxides have not as yet formed on the new target. To reproducibly attain the same composition, a new target or an established target should be consistently employed.) The mobility of these materials satisfies the appropriate criteria, and thus generally 50 to 500-Angstrom inclusions of crystalline indium oxide are formed in a continuous phase of amorphous indium oxide. The flux of the two materials in the sputtering procedure is controlled by, in turn, controlling the particles, e.g., ions, utilized to sputter the target material and by controlling the pressure of the reactive gas present. Typically, ion fluxes in the range 0.1 mA/cm$^2$ to 1.0 mA/cm$^2$ are utilized with reactive gas partial pressures in the range $10^{-5}$ Torr to $10^{-3}$ Torr. (It is acceptable to utilize inert gases such as argon and krypton with the reactive gas to sputter materials from the target. The relative amount of the inert gas present is not critical. However, generally total pressures in the range $10^{-4}$ Torr to $10^{-3}$ Torr are advantageously utilized.) It is also possible to use a mixture of reactive gases. For example, it is possible to utilize air and thus when sputtering a metal, form both oxides and nitrides.

It is desirable, although not essential, that the radiation, e.g., ions, utilized to induce sputtering is relatively uniformly distributed over the target and that the substrate is subjected to a relatively uniform flux. This is accomplished by conventional techniques. For example, the target should be at least as large as the ion beam diameter and should be larger in diameter than the deposition substrate. Additionally, the spacing between the target and the substrate should typically be in the range 5 cm to 50 cm for beam diameters on the order of 3 cm. For distances less than 5 cm, the substrate is subject to bombardment by the sputtering radiation, while distances greater than 50 cm are inefficient in the transfer of target material to the substrate.

The composition of the substrate is not critical provided the fluxes incident on the substrate satisfy the mobility criteria. Substrates such as glass, aluminum oxide, polymethyl methacrylate, potassium chloride, and sodium chloride are useful. It is, however, desirable that the substrate have a smooth surface so that the mobility of the incident materials is not unduly restricted.

The temperature of the substrate also influences the mobility of the incident material and thus should be adjusted utilizing a control sample so that the mobility criteria are satisfied. However, generally it is advantageous, although not essential, that the deposition occur at room temperature. At elevated temperatures, incident material has a tendency not to adhere to the deposition substrate. Cooling of the substrate, although not an initial problem, also produces disadvantageous results. For example, as the substrate is warmed after deposition, structural changes are often introduced in the deposited material or substrate, causing undesirable strain in the resulting medium.

It has been found that for a specific class of the inventive information storage media, exemplified by the indium/indium oxide material produced utilizing oxygen pressure in the range $2 \times 10^{-4}$ Torr to $5 \times 10^{-4}$ Torr, an erasable storage medium is obtained. This medium is written as previously described. The written information is erased by defocusing a beam, e.g., a krypton-argon ion laser beam, having a wavelength that is substantially absorbed by the medium and making it incident on the written regions. Defocusing is accomplished, for example, by displacing the surface plane of the medium with respect to the focal plane of the optics used in writing. Typically, a level of defocusing of about 100 $\mu$m is utilized.

The following examples are illustrative of the invention.

EXAMPLE 1

A glass slide measuring approximately 1 inch $\times$ 1 inch $\times$ 25 mils was cleaned by scrubbing it with a soapy water solution, immersing it in acetone, and immersing it in isopropanol. The slide was blown dry utilizing dry nitrogen and placed on the sample holder of conventional thermal evaporation apparatus. The boat of the evaporation apparatus was charged with aluminum (99.99 percent purity). The apparatus was evacuated to a base pressure of $10^{-6}$ Torr, and evaporation was initiated by resistively heating the boat at a level sufficient to produce a deposition rate of approximately 10 Angstroms/second. Deposition was continued until an approximately 2000-Angstrom thick, specularly reflecting layer was formed.

The aluminum was then anodized by immersing it in an aqueous solution of 3 percent by weight tartaric acid (pH of approximately 2), where the pH was adjusted to approximately 5.5 with NH$_4$OH. An aluminum wire (99.99 percent purity) and the sample were immersed vertically in the solution, and electrical pressure contacts were made to each, with these contacts outside the bath. The cell was current biased at a level of 1 milliampere/cm$^2$ of the immersed aluminum film, and this biasing was continued until a potential difference of 60 volts was reached after approximately $\frac{1}{2}$ hour. The resulting anodized region had a thickness of approximately 840 Angstroms. The sample was removed from the solution, rinsed in deionized water, and then blown dry in dry nitrogen.

Figure 3:
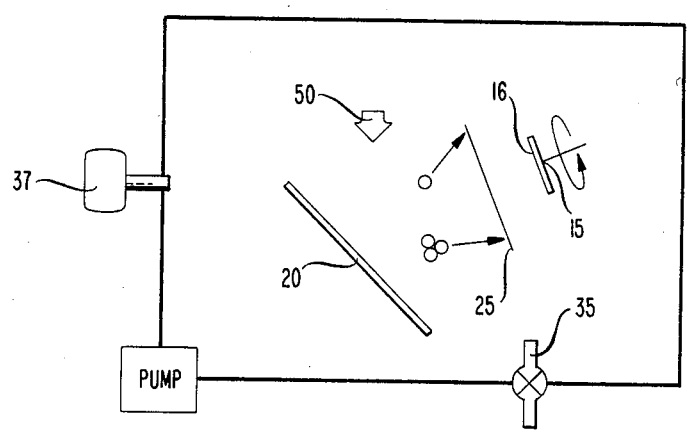
FIG. 3 is illustrative of an apparatus suitable for forming the inventive media.

The sample was then mounted on a rotating sample holder, 15 of FIG. 3, of a reactive ion beam sputtering deposition apparatus. The apparatus included a square indium target 20, measuring $\frac{1}{8}$ inch in thickness and 10 cm on a side. The deposition surface of the sample, 16, was approximately 2$\frac{1}{8}$ inch from the face of the indium target impacted by the ion beam. The substrate deposition surface was positioned at an angle of 30 degrees to the ion beam direction. The metal target was placed approximately 1$\frac{1}{2}$ inches from the last grid of the ion beam accelerator. A shutter, 25, was positioned between the target and the sample. The apparatus was evacuated to a base pressure of approximately 1.5$\times 10^{-5}$ Torr. Oxygen was introduced through a bleed valve, 35, at a rate sufficient to produce a pressure of 3.2$\times 10^{-4}$ Torr as measured by an ionization gauge, 37, positioned as shown in FIG. 3. After the oxygen flow had stabilized (approximately 2 hours), sufficient argon was introduced into the ion grid acceleration chamber to produce a total pressure in the deposition chamber of approximately $2 \times 10^{-3}$ Torr. Argon was ionized by resistive heating of a tantalum cathode, a resulting current of 5 milliamperes was accelerated through the grid system to a potential of 500 volts, and then was directed, 50, to a target biased at $-3$ kV with respect to ground potential. The resulting reactive sputtering produced a flux rate at the shutter of approximately 100 Angstroms/minute, as determined by a quartz crystal thickness monitor. The flux was monitored until the rate became constant. The sample was then rotated at a rate of approximately 5 Hz and the shutter displaced to expose the substrate to the deposition fluxes. The deposition was continued for approximately 1 minute to produce a deposited layer thickness of 100 Angstroms. The ion beam was extinguished, the chamber was brought to atmospheric pressure, and the sample was removed. The resulting structure was dark blue. (A layer deposited directly on a glass slide without intermediary aluminum and aluminum oxide regions exhibited a relatively transparent appearance with a grey tint and had a sheet resistance of approximately 3500 ohms.)

Figure 4:
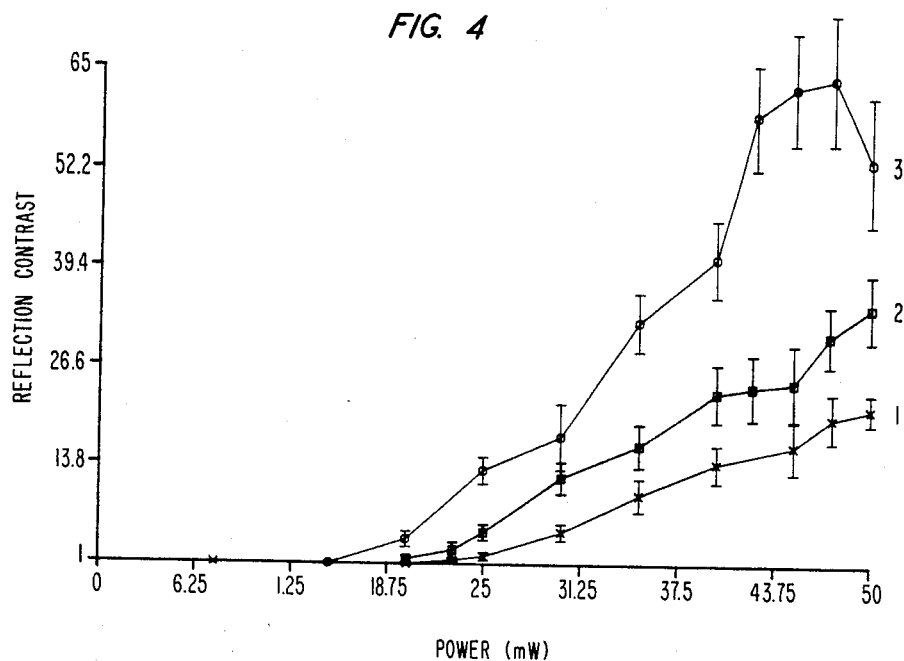
FIGS. 4 and 5 illustrate properties achievable with the invention.

The samples were exposed in a $10 \times 10$ dot array pattern using the apparatus described in *Proceedings of SPIE*, 329, Craighead et al, page 202 (1982). Exposures were performed using a spot size of approximately 1 μm and using various pulse lengths (50–1000 nanoseconds) at power levels of 50 milliwatts or less for 6470-Angstrom light. The results are shown in FIG. 4 where curves 1, 2, and 3 refer to pulse lengths of 100 nanoseconds, 300 nanoseconds, and 1000 nanoseconds, respectively. It should be noted that the 1000-nanosecond pulse length yielded contrasts up to 60.

EXAMPLE 2

The procedure of Example 1 was followed except the anodization process was terminated when a potential difference of approximately 30 volts was reached. Additionally, the oxygen partial pressure during deposition was $1.5 \times 10^{-4}$ Torr. The resulting structure was grey in color rather than dark blue. The contrast observed for this structure was approximately 3. Thus, varying the thickness of the dielectric layer substantially affects the efficiency of writing.

EXAMPLE 3

Figure 5:
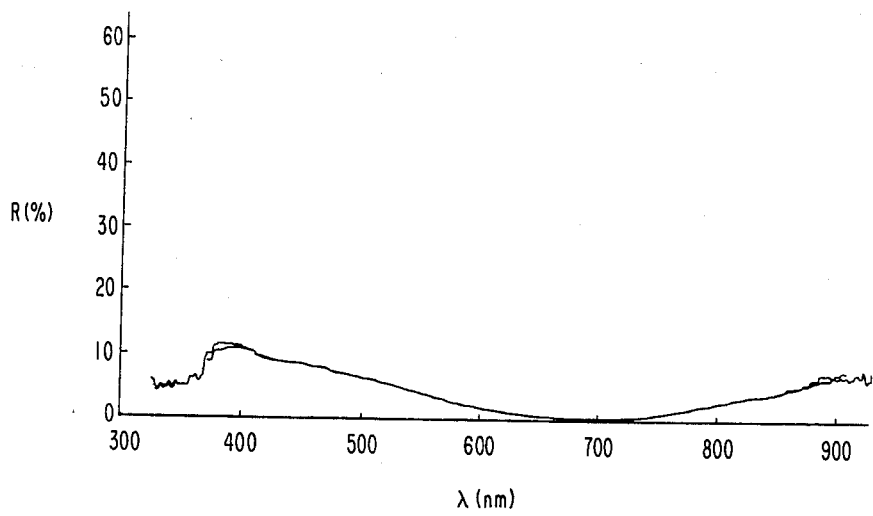

The procedure of Example 1 was followed except the sample was not exposed to writing electromagnetic radiation. Instead, the reflectance of the sample over a range of wavelengths was spectrophotometrically measured. The results are shown in FIG. 5. As can be seen, the samples are highly absorbing at specific wavelengths, as demonstrated by the low reflectivity at 7000 Angstroms.

EXAMPLE 4

The procedure of Example 1 was followed except the anodization process was omitted. Instead, a layer of resist material formed from a solution purchased from the Shipley Company, denominated AZ-1350J, was utilized. The solution was diluted with a thinner also procured from the Shipley Company. A small quantity of the thinned solution was placed on the sample and the sample spun. The thickness of the resist layer was controlled by adjusting the speed at which the sample was spun and the level of dilution of the resist solution. By employing various resist thicknesses, samples were produced with colors spanning the entire visual spectral range. The blue samples were exposed as described in Example 1. The polymer material reduced the thermal loss and thus reduced the writing power threshold by a factor of 4.

EXAMPLE 5

The procedure of Example 1 was followed except the anodization was continued until a potential difference of 46 volts was reached. Additionally, rather than introducing oxygen into the deposition chamber, a base pressure of approximately $1 \times 10^{-5}$ Torr was established and then nitrogen was introduced at a partial pressure of $2 \times 10^{-4}$ Torr. The total pressure including the argon partial pressure was approximately $3 \times 10^{-3}$ Torr. The deposition was continued for approximately 30 seconds, producing an indium nitride containing layer with a thickness of approximately 50 Angstroms. The color of the structure was light purple.

EXAMPLE 6

The procedure of Example 1 was followed except the indium/indium oxide layer was deposited directly on the glass slide. A layer of poly(methyl methacrylate) (PMMA) was deposited on this indium containing layer from a chlorobenzene solution by conventional spinning techniques. (Controlled samples were utilized to determine an appropriate spinning speed and solution concentration to yield a PMMA thickness that resulted in a blue color for the final structure.) The PMMA was baked at a temperature of approximately 70 degrees C. in an air ambient. An aluminum layer having a thickness of approximately 1000 Angstroms was then deposited, as described in Example 1, on the PMMA. The writing threshold was approximately 6 to 8 milliwatts with a contrast of approximately 4. (The contrast could be significantly increased by carefully controlling the PMMA layer thickness.)

EXAMPLE 7

The procedure of Example 6 was followed except a PMMA layer was interposed between the glass and the indium/indium layer. This layer had a thickness of about 2000 Angstroms and was produced by conventional spinning procedures together with a 30-minute bake at 90 degrees C. in an air atmosphere. The resulting writing threshold was lowered to approximately 4 milliwatts due to the increased thermal isolation and the contrast measured at a power of 30 milliwatts and a pulse length of 50 nanoseconds was 2.8. (The contrast could be significantly increased by appropriately adjusting the thickness of the PMMA layers.)

EXAMPLE 8

The procedure of Example 1 was followed except a copper target rather than an indium target was utilized. This sputtering system, however, was spatially inverted as compared to the system shown in FIG. 3. A base pressure of $2 \times 10^{-6}$ Torr was employed, and sufficient oxygen was introduced to yield a partial pressure of $7 \times 10^{-5}$ Torr. After introduction of the argon, the total pressure was approximately $7.0 \times 10^{-4}$ Torr. An argon ion current density of approximately 0.7 milliamperes/cm$^2$ was accelerated utilizing a final grid potential of 1000 volts and a grounded target. The deposition was continued for 97 seconds and yielded a layer thickness of approximately 100 Angstroms. (The sheet resistance of the copper containing layer was approximately 1700 ohms.) Utilizing a 37-milliwatt writing beam and a 50-nanosecond pulse length, a contrast of approximately 2 was obtained. (This contrast could be significantly increased simply by adjusting the total thickness of the aluminum oxide layer.) It should be noted that the writing properties of this copper oxide layer were essentially the same as the previously described indium material.

EXAMPLE 9

The procedure of Example 8 was followed except nitrogen rather than oxygen was introduced. The base pressure was $6.8 \times 10^{-6}$ Torr, and the nitrogen pressure of $2 \times 10^{-3}$ Torr yielded a total pressure including the argon partial pressure of $2.5 \times 10^{-3}$ Torr. The measured threshold was 15 milliwatts, and the contrast measured at a pulse length of 1000 nanoseconds and a power of 35 milliwatts was 2.5. (The contrast could be substantially increased by appropriately changing the aluminum oxide thickness.)

What is claimed is:

1. A body with storage regions suitable for the storage of information by writing said information to produce a written region through the production of an optical change in at least one of said storage regions with incident energy, said body comprising a substrate, an energy-sensitive medium, and means for enhancing the contrast of said optical change through an optical effect chosen from the group consisting of interference and reflection effects, characterized in that said medium comprises a first material forming a first phase and a second material forming a second phase, said first phase being continuous and said second phase being discontinuous in the form of inclusions in said medium, wherein the absolute rms deviation of the thickness of said energy-sensitive medium in said storage regions is less than 25 Angstroms, wherein there is, on average, at least 100 inclusions in each of said storage regions, wherein said first material comprises a substance selected from the group consisting of metal and composition containing atoms of a metallic element and said second material comprises a substance selected from the group consisting of metal and composition containing atoms of a metallic element, and wherein said first phrase and said second phrase are compositionally distinguishable.

2. The body of claim 1 wherein said first and second materials comprise a metal and a composition of said metal.

3. The body of claim 2 wherein said metal comprises indium.

4. The body of claim 3 wherein said composition comprises an indium oxide or an indium nitride.

5. The process of claim 2 wherein said metal is chosen from the group consisting of lead, tin, copper, and aluminum.

6. The body of claim 1 formed by directing a first composition flux and a flux of said second composition onto said substrate wherein the composition of one of said fluxes has a relatively high mobility on said substrate, the composition of said other fluxes has a relatively low mobility, and said high mobility composition has a low mobility in the presence of said low mobility composition.

7. The body of claim 6 wherein said high mobility composition comprises indium.

8. The body of claim 7 wherein said low mobility composition comprises an indium oxide or an indium nitride.

9. The body of claim 6 wherein said high mobility composition comprises a member chosen from the group consisting of lead, tin, copper, and aluminum.

10. The body of claim 6 wherein said fluxes are produced by sputtering a material in the presence of a reactive gas.

11. The body of claim 10 wherein said sputtered material comprises indium.

12. The body of claim 11 wherein said reactive gas comprises oxygen or nitrogen.

13. The body of claim 10 wherein said sputtered material comprises a member chosen from the group consisting of lead, tin, copper, and aluminum.

14. The body of claim 13 wherein said reactive gas comprises oxygen.

15. The process of storing information in storage regions of a body suitable for said storage comprising the steps of subjecting at least a portion of said storage regions to energy capable of inducing an optical change in said regions characterized in that said body comprises a medium sensitive to said energy and a substrate, said medium comprising a first material forming a first phase and a second material forming a second phase, said first phase being continuous and said second phase being discontinuous in the form of inclusions in said medium, wherein the absolute rms deviation of the thickness of said energy-sensitive medium in said storage regions is less than 25 Angstroms, wherein there are, on average, at least 100 inclusions in each of said storage regions, wherein said optical change is induced through a change in the amount of at least one phase present in said written storage area, wherein said first material comprises a substance selected from the group consisting of metal and composition containing atoms of a metallic element and said second material comprises a substance selected from the group consisting of metal and composition containing atoms of a metallic element, and wherein said first phrase and said second phrase are compositionally distinguishable.

16. The process of claim 15 wherein said first and second materials comprise a metal and a composition of said metal.

17. The process of claim 16 wherein said metal comprises indium.

18. The process of claim 17 wherein said composition comprises an indium oxide or an indium nitride.

19. The process of claim 16 wherein said metal is chosen from the group consisting of lead, tin, copper, and aluminum.

20. The process of claim 15 formed by directing a flux of a first composition and a flux of a second composition onto said substrate wherein the composition of one of said fluxes has a relatively high mobility on said substrate, the composition of said other fluxes has a relatively low mobility, and said high mobility composition has a low mobility in the presence of said low mobility composition.

21. The process of claim 20 wherein said high mobility composition comprises indium.

22. The process of claim 21 wherein said low mobility composition comprises an indium oxide or an indium nitride.

23. The process of claim 20 wherein said high mobility composition comprises a member chosen from the group consisting of lead, tin, copper, and aluminum.

24. The process of claim 20 wherein said fluxes are produced by sputtering a material in the presence of a reactive gas.

25. The process of claim 24 wherein said sputtered material comprises indium.

26. The process of claim 24 wherein said sputtered material comprises a member chosen from the group consisting of lead, tin, copper, and aluminum.

27. The process of claim 26 wherein said reactive gas comprises oxygen.

* * * * *